(12) United States Patent
Soldner et al.

(10) Patent No.: US 8,335,064 B2
(45) Date of Patent: Dec. 18, 2012

(54) ESD CLAMP ADJUSTMENT

(75) Inventors: Wolfgang Soldner, Unterhaching (DE);
Gernot Langguth, Oberhaching (DE);
Christian Russ, Diedorf (DE); Harald Gossner, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 352 days.

(21) Appl. No.: 12/826,983

(22) Filed: Jun. 30, 2010

(65) Prior Publication Data
US 2012/0002333 A1 Jan. 5, 2012

(51) Int. Cl.
*H02H 9/00* (2006.01)
*H02H 1/00* (2006.01)
*H02H 1/04* (2006.01)
*H02H 3/22* (2006.01)
*H02H 9/06* (2006.01)

(52) U.S. Cl. .......................... 361/56; 361/118
(58) Field of Classification Search .............. 361/56
See application file for complete search history.

(56) References Cited

U.S. PATENT DOCUMENTS

| | | | |
|---|---|---|---|
| 5,311,391 A | 5/1994 | Dungan et al. | |
| 5,508,649 A | 4/1996 | Shay | |
| 5,617,283 A | 4/1997 | Krakauer et al. | |
| 6,803,633 B2 * | 10/2004 | Mergens et al. | 257/358 |
| 7,336,459 B2 * | 2/2008 | Chen | 361/56 |
| 7,405,435 B2 * | 7/2008 | Sato | 257/173 |
| 2007/0285854 A1 * | 12/2007 | Rodgers et al. | 361/56 |
| 2008/0239599 A1 | 10/2008 | Yizraeli et al. | |
| 2008/0304191 A1 | 12/2008 | Riviere et al. | |

OTHER PUBLICATIONS

Richard Merill, "ESD Design Methodology", proceedings of EOS/ESD conference, Lake Buena Vista, Florida, p. 233, 1993.
Jeffrey Dunnihoo, "ESD Protection for High-Speed I/O Signals", ESD Protection: http://www.ce-mag.com/archive/03/ARG/dunnihoo.html, Jun. 30, 2010, p. 1-8.
Yehuda D. Yizraeli, "Novel ESD Clamper Circuit Based on Dual-Level Detection", International ESD Workshop IEW 2007, Lake Tahoe, Claifornia, p. 1-28.

* cited by examiner

*Primary Examiner* — Dharti Patel
(74) *Attorney, Agent, or Firm* — Eschweiler & Associates, LLC

(57) ABSTRACT

Embodiments of this disclosure relate to electrostatic discharge (ESD) protection techniques. For example, some embodiments include a variable resistor that selectively shunts power of an incoming ESD pulse from a first circuit node to a second circuit node and away from a semiconductor device. A control voltage provided to the variable resistor causes the transistor to change between a fully-off mode where only sub-threshold current, if any, flows; a fully-on mode wherein a maximum amount of current flows; and an analog mode wherein an intermediate and time-varying amount of current flows. In particular, the analog mode allows the ESD protection device to shunt power more precisely than previously achievable, such that the ESD protection device can protect semiconductor devices from ESD pulses.

26 Claims, 4 Drawing Sheets

ESD CLAMP ADJUSTMENT

BACKGROUND

Integrated circuits (ICs) include external pins that allow the ICs to be connected to other external circuit elements. Although these external pins are required as a practical matter so ICs can be included in electronic products, unfortunately these external pins also make semiconductor devices on the ICs susceptible to potentially damaging electrostatic discharge (ESD) pulses. An ESD pulse, which is a sudden and unexpected voltage and/or current discharge, can transfer energy to devices on the IC through the external pins from an outside body (e.g., a human body, which can be approximated in modeling by a human body model (HBM)). ESD pulses can also affect internal nodes of the IC, as well as discrete devices that are not associated with ICs. In any case, an ESD pulse can damage electronic devices, for example by "blowing out" a gate oxide of a transistor in cases of high voltage or by "melting" an active region area of a device in cases of high current, causing junction failure. If devices are damaged by an ESD pulse, the electronic product can be rendered less operable than desired, or can even be rendered inoperable altogether.

To protect devices from ESD pulses, engineers have developed ESD protection devices. FIG. 1 shows an example of an integrated circuit 100 that includes one or more semiconductor devices 102 (e.g., transistors arranged as part of an application specific integrated circuit (ASIC)), which are coupled to an exterior circuit assembly via an external pin 104. The external pin 104 can be a supply pin that supplies a DC supply voltage (e.g., VDD or VSS) to the devices 102, or can be an input/output (I/O) pin that transfers input or output signals therefrom, for example. A conventional ESD protection device 106 is coupled between the semiconductor device(s) 102 and the external pin 104 to mitigate damage due to ESD pulses 108.

As shown in FIG. 2, if an ESD pulse 108 occurs (e.g., starting at time 110), the ESD protection device 106 detects the ESD pulse 108 and shunts the power associated with it away from the semiconductor device(s) 102 (e.g., as shown by arrow $P_{ESD}$), thereby preventing damage to the semiconductor device(s) 102. In addition to this shunting, which occurs during actual ESD events, this functionality can also be falsely triggered, for example, by supply switching noise, fast power up sequences having rise times comparable to ESD events, and other non-ESD events.

Although this conventional ESD protection functionality is well understood, the inventors have appreciated a shortcoming in that conventional ESD protection devices, when active, can undesirably reduce the desired voltage level of the signal expected to be delivered from the external pin 104 to the device(s) 102. For example, FIG. 2 shows an example where the external pin 104 is a supply pin that is expected to provide a DC voltage supply (VDD) of approximately 3.3 volts to the semiconductor device(s) 102. However, upon a 100 volt ESD pulse triggering the ESD protection device 106, the supply voltage that actually reaches the semiconductor device(s) 102 is reduced to about 1.5 V during the ESD pulse. See line 112. Because 1.5 V is less than the expected VDD and may be less than required to operate the semiconductor device(s) 102 (e.g., transistors in an ASIC), this can cause instability in the integrated circuit 100 and systems associated therewith. Other sample ESD pulses are also illustrated in FIG. 2, along with their corresponding effect on VDD delivered to the devices on the IC.

The applicants note that FIG. 2 is a simulation result in which transmission line pulsing (TLP) is used to approximate an ESD event. In FIG. 2's simulation, a constant current is delivered to a convention ESD protection device over a 100 ns period. Thus, at the start of the ESD pulse, an artificial voltage overshoot is exhibited, which is due to "slow" transistors. In real ESD events, the current actually delivered often tends to be transient and not as constant as shown by the simulation results of FIG. 2.

In view of the above, the inventors have devised ESD protection techniques that provide adequate ESD protection while still ensuring that substantially the same voltage as expected to be delivered to device(s) via an external pin (or other circuit node) is, in fact, delivered to the device(s) via the external pin (or other circuit node).

DETAILED DESCRIPTION

Figure 1:
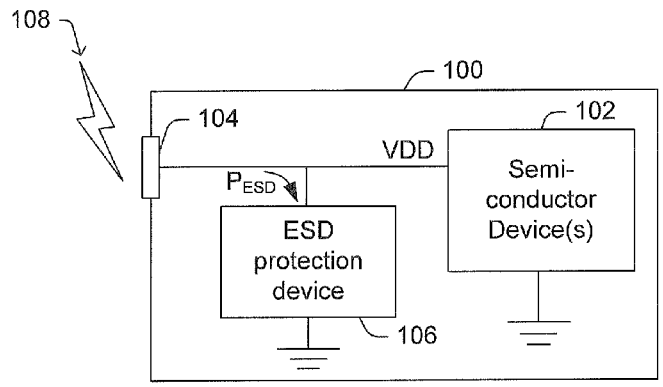
FIG. 1 shows an integrated circuit that makes use of a conventional ESD protection circuit.

One or more implementations of the present invention will now be described with reference to the attached drawings, wherein like reference numerals are used to refer to like elements throughout. The drawings are not necessarily drawn to scale.

Various embodiments described below relate to improved ESD protection techniques. In some embodiments, an ESD protection device includes a variable resistor (e.g., a transistor) that selectively shunts power of an incoming ESD pulse from a first circuit node to a second circuit node and away from a semiconductor device on the IC. When an ESD pulse is not present, the first circuit node supplies a signal within an expected voltage range to the semiconductor device. To help ensure that the first circuit node still delivers the signal within the expected voltage range during an incoming ESD pulse, a regulator within the ESD protection device provides feedback to adjust a control voltage on a control terminal of the variable resistor. In this way, the semiconductor device is protected from the incoming ESD pulse while still being provided with a signal having a voltage level that is equal to (or slightly greater than) its expected voltage range. For example, if the first circuit node is designed to supply a DC supply voltage (VDD) of approximately 3.3 volts to a semiconductor device on the IC, the regulator helps keeps the voltage supplied to the semiconductor device at substantially 3.3 volts (or slightly greater) during an ESD pulse, while at the same time keeping the supplied voltage low enough to prevent damage to the semiconductor device.

Figure 3:
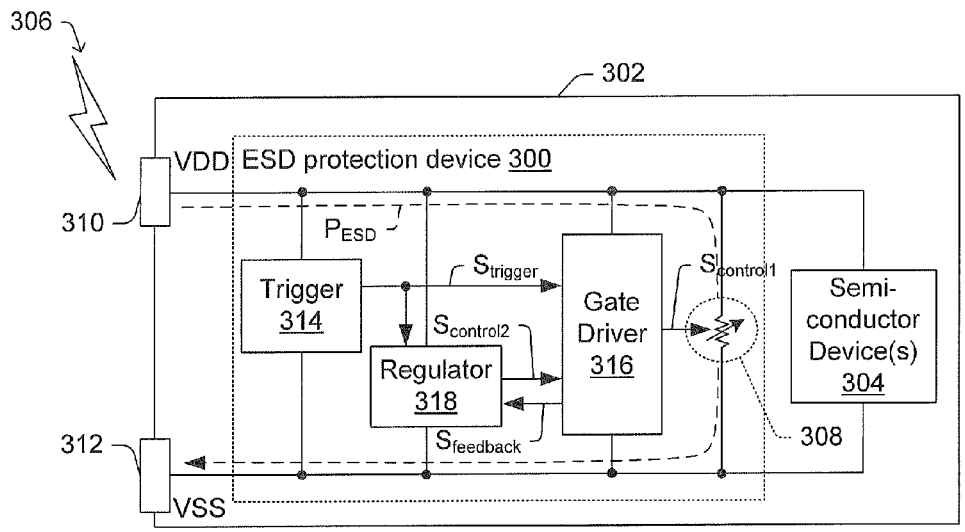
FIG. 3 shows functional block diagram of an ESD protection circuit in accordance with some embodiments.

Referring to FIG. 3, one can see an ESD protection device 300 in accordance with some embodiments. Like the previously discussed implementation of FIG. 1, the ESD protection device 300 can be included on an integrated circuit 302 on which one or more semiconductor devices 304 are disposed, although it could also be used with discrete devices rather than an IC. To protect the semiconductor devices 304 from an incoming ESD pulse 306, the protection device 300 includes variable resistor 308 that selectively shunts the power of the ESD pulse 306 from a first circuit node 310 to a second circuit node 312 and away from the semiconductor devices 304. It will be appreciated that although FIG. 3 shows the first and second circuit nodes 310, 312 as external pins of the IC 302, in other embodiments the first and second circuit nodes 310, 312 can be located on internal nodes within the IC 302.

More particularly, the ESD protection device 300 includes a trigger element 314, a gate driver element 316, and a regulator element 318, which are operably coupled as shown. As will be appreciated in more detail further herein, the trigger element 314 monitors power on the first circuit node 310 and provides a trigger signal, $S_{trigger}$, indicative of whether the monitored power is representative of an incoming ESD pulse (e.g., ESD pulse 306). When asserted, the trigger signal activates both the gate driver 316 and the regulator element 318. Upon being activated, gate driver 316 provides a first control signal, $S_{control1}$, to a control terminal of the variable resistor 308 to adjust its resistance so an appropriate amount of power is shunted there over (e.g., as shown by arrow $P_{ESD}$). In this way, the gate driver 316 keeps the voltage and/or current delivered to the device 304 below an upper threshold (see e.g., line 402 in FIG. 4) to prevent damage to the device 304 due to the ESD pulse 306.

Figure 2:
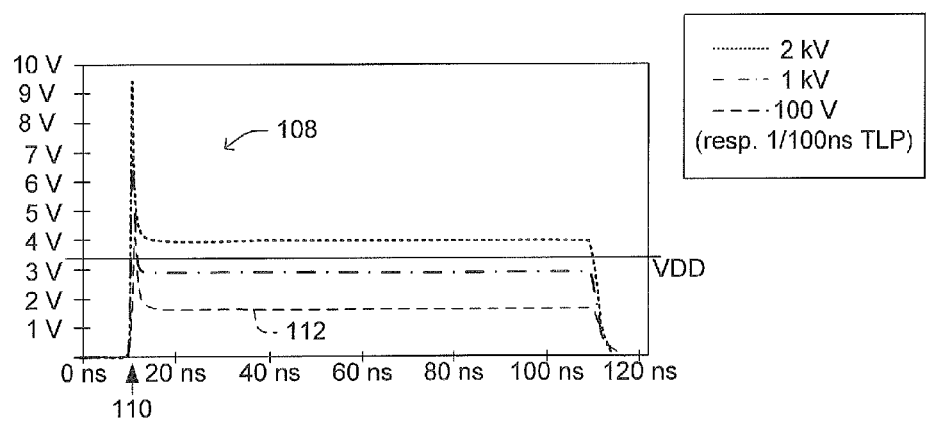
FIG. 2 shows waveforms associated with FIG. 1's conventional ESD protection circuit during an ESD pulse.

In addition, to prevent the variable resistor 308 from shunting too much power from the device(s) 304 (e.g., thereby unduly reducing a voltage supplied to the devices 304 as previously shown in FIG. 2), the regulator element 318 monitors the actual voltage delivered to the device 304 via the first circuit node 310 and provides a feedback signal, $S_{feedback}$, indicative thereof. If the actual voltage approaches a predetermined voltage threshold (see e.g., line 404 in FIG. 4), the regulator element 318 provides a second control signal, $S_{control2}$, in a manner which causes the gate driver 316 to change the first control signal $S_{control1}$ to limit the amount of current shunted through the variable resistor 308.

Figure 4:
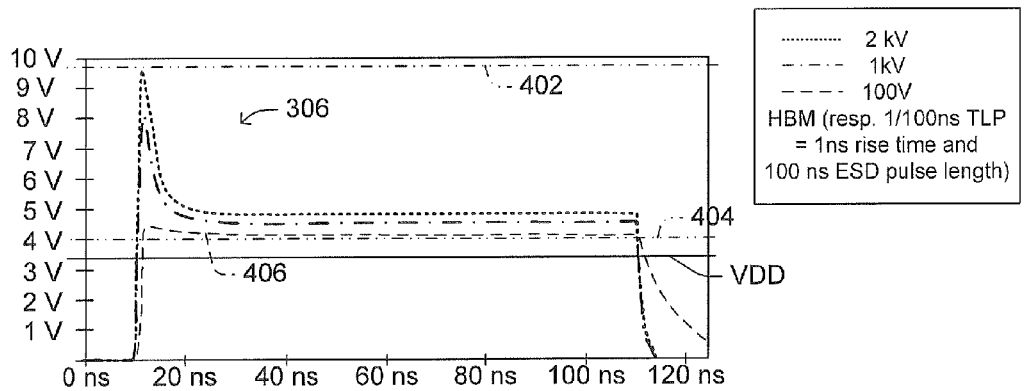
FIG. 4 shows waveforms associated with one example of FIG. 3's ESD protection circuit during an ESD pulse.

As shown in FIG. 4, these techniques keep the voltage supplied to the device during an ESD pulse between an upper threshold 402 and a lower threshold 404. For example, FIG. 4 shows examples of ESD pulses where the semiconductor device(s) 304 include transistors designed to operate at a DC supply voltage (VDD) of approximately 3.3 volts. Thus, during a 100 V ESD pulse, the actual voltage supplied to the device 304 remains at approximately 4.0V or greater, as shown by line 406. Thus, ESD protection device 300 helps ensure the first circuit node 310 delivers a supply voltage at substantially 3.3 volts (or greater) to supply the devices 304 with their expected supply voltage.

Figure 5:
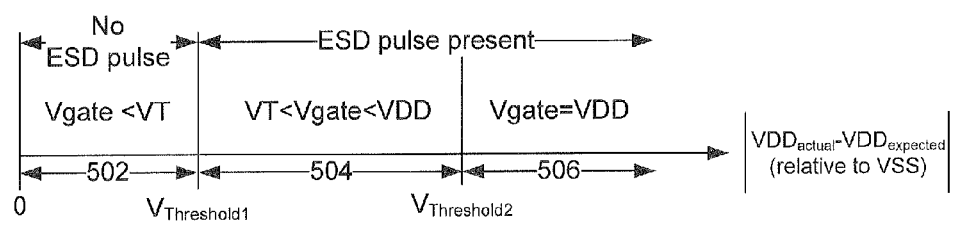
FIG. 5 shows one manner in which a gate voltage of a shunt transistor can be varied in accordance with some embodiments.

The variable resistor can take different forms depending on the implementation. For example, in some embodiments, variable resistor can be a thyristor. In other embodiments, the variable resistor 308 can be a transistor (e.g., an n-type MOSFET), and the first control signal, $S_{control1}$, consists of a gate voltage. Often, the gate voltage will operate this transistor in an analog manner to facilitate more precise shunting than previously achievable. FIG. 5 shows an example of how such an analog control scheme can be carried out with regards to an n-type MOSFET.

As can be seen from FIG. 5's chart, when no ESD pulse is present during 502 and the magnitude of the quantity (VDD$_{actual}$ minus VDD$_{expected}$) is below a first threshold voltage ($V_{Threshold1}$), the gate driver supplies a gate voltage, $V_{gate}$, which is less than the threshold voltage (VT) of the n-type transistor. Consequently, during this state, the n-type transistor is in a sub-threshold state and substantially no current is shunted away from the on chip semiconductor devices (e.g., no current is shunted from 310 to 312 over 308 in FIG. 3).

In contrast, when an ESD pulse is present during 506 and the magnitude of the quantity (VDD$_{actual}$ minus VDD$_{expected}$) is greater than a second threshold voltage ($V_{T2}$), the gate driver supplies a gate voltage, $V_{gate}$, which is substantially equal to the expected supply voltage VDD. Consequently, during this state the n-type transistor is in a saturation mode that shunts the maximum current away from the on chip semiconductor devices (e.g., maximum current is shunted from 310 to 312 over 308 in FIG. 3).

When the ESD pulse is present during 504 and the magnitude of (VDD$_{actual}$ minus VDD$_{expected}$) is between the first and second threshold voltages ($V_{Threshold1}$, $V_{Threshold2}$), the gate driver supplies a gate voltage, $V_{gate}$, which is between the threshold voltage VT of the n-type transistor and the actual supply voltage VDD on node 310. Consequently, during this state 504, the n-type transistor is in saturation, but the amount of current it shunts away changes according to the precise gate voltage present. In this way, during state 504, the n-type transistor acts in an analog manner to selectively shunt a suitable amount of current away from the semiconductor devices (e.g., 304) to prevent ESD damage and concurrently help ensure adequate supply voltages/headroom for the semiconductor devices. Thus, unlike conventional ESD protection devices where the ESD protection device is either "fully-on" or "fully-off", some embodiments disclosed herein provide for an analog mode of operation that facilitates more accurate shunting than previously achievable.

Figure 6:
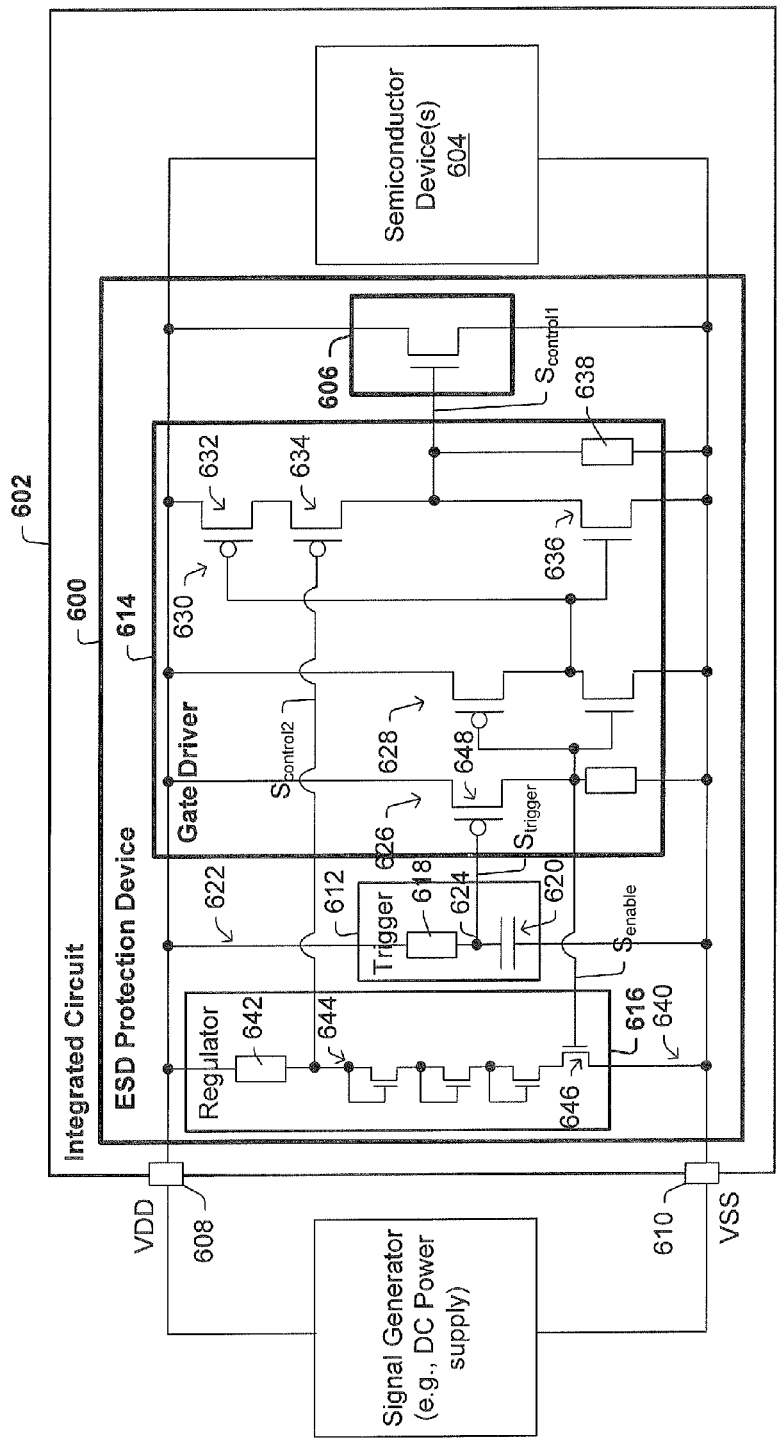
FIG. 6 shows a circuit schematic of an ESD protection circuit in accordance with some embodiments.

FIG. 6 shows another embodiment of an ESD protection device 600 in accordance with some embodiments. As with some previously discussed implementations, the ESD protection device 600 is included on an integrated circuit 602 on which one or more semiconductor devices 604 are disposed. To protect the semiconductor devices 604 from an incoming ESD pulse (not shown), the ESD protection device 600 includes a shunt transistor 606 that selectively shunts the power of the ESD pulse from a first circuit node 608 to a second circuit node 610 and away from the semiconductor devices 604. It will be appreciated that although FIG. 6 shows the first and second circuit nodes 608, 610 as external pins of the IC 602, in other embodiments the first and second circuit nodes 608, 610 can be internal nodes within the IC 602 or could be nodes between discrete devices not on an IC.

Like FIG. 3's embodiment, the ESD protection device 600 includes a trigger element 612, a gate driver element 614, and a regulator element 616. In the illustrated embodiment, the trigger element 612 includes a resistor 618 and a capacitor 620 disposed on a current path 622 extending between the first circuit node 608 and second circuit node 610. An output node 624 between the resistor and capacitor supplies a trigger signal thereat. It will be appreciated that although FIG. 6 shows an RC trigger element, other trigger elements could also be used, including but not limited to: an output of supply noise detector (e.g., voltage detector), or a control signal provided from a neighboring voltage domain (e.g., neighboring sector on the circuit) in which an ESD event is detected.

The gate driver circuit 614 includes a series of driver elements (e.g., 626, 628, 630) in series with one another. A first driver element 626 has an input coupled to the trigger element's output node 624, and a last of these driver elements 630 has an output coupled to the gate of the shunt transistor 606. The last driver element 630 includes a first p-type transistor 632, a second p-type transistor 634, an n-type transistor 636, and a resistor 638. The first p-type transistor 632 has a drain coupled to the first circuit node 608, and the n-type transistor 636 has a source coupled to the second circuit node 610. The second p-type transistor 634 has a drain coupled to a source of the first p-type transistor 632. Further, a source of the second p-type transistor 634 and a drain of the n-type transistor 636 are coupled to the control gate of the shunt transistor 606. Although FIG. 6 shows three driver elements in series, it will be appreciated that any number of driver elements, including even and odd numbers of such elements, could be included in other embodiments.

The regulator element 616 includes a regulator current path 640 extending between the first circuit node 608 and second circuit node 610. A resistive element 642, a string of diodes 644, and regulator switch 646 lie on the current path 640. A control node arranged between the resistive element and the series of diodes provides a second control signal to the second p-type transistor 634 in the gate driver circuit.

During operation, the trigger element 612 provides a trigger signal from its output node to the gate driver circuit 614, wherein a voltage level of the trigger signal indicates whether an ESD pulse has occurred. For example, an incoming ESD pulse will typically cause the capacitor 620 to discharge, thereby pulling the output node/trigger signal on 624 low for a brief time to indicate the ESD pulse.

While the trigger signal is low (e.g., indicating the presence of the incoming ESD pulse), a p-type transistor 648 in the gate driver asserts an enable signal that closes the regulator switch 646, thereby initiating current flow through the regulator 640. The trigger signal also propagates through the driver elements in the gate driver, ultimately causing the first p-type transistor 632 to enter saturation and putting the n-type transistor 636 in sub-threshold mode. This establishes a source-drain bias across the second p-type transistor 634.

Because the enable signal causes current to flow through the regulator 616, a voltage is established on the regulator's output node so a second control signal is supplied to the second p-type transistor 634. When the ESD pulse is present, the voltage magnitude of the second control signal is greater than the threshold voltage of the second p-type transistor 634. The voltage level of the second control signal varies in an analog manner to "tune" the current through the second p-type transistor 634, thereby correspondingly "tuning" the first control signal or gate voltage supplied to the shunt transistor 606. In this manner, the second p-type transistor 634 can vary between triode mode and saturation mode to better control of the gate voltage applied to the shunting transistor 606 than previously achievable.

Notably, because the regulator element 616 continuously monitors the voltage on the first circuit node 608 throughout the ESD pulse, the second control signal supplied to the gate of the second p-type transistor 634 can selectively adjust the gate voltage supplied to the shunt transistor 606 throughout the duration of the ESD pulse. This is believed to be an improvement over traditional schemes wherein ESD protection circuits typically clamp for a predetermined time after an ESD pulse occurs, rather than performing on-going monitoring throughout the ESD pulse. Consequently, this feature can provide for more precise power shunting than previously achievable.

Figure 7:
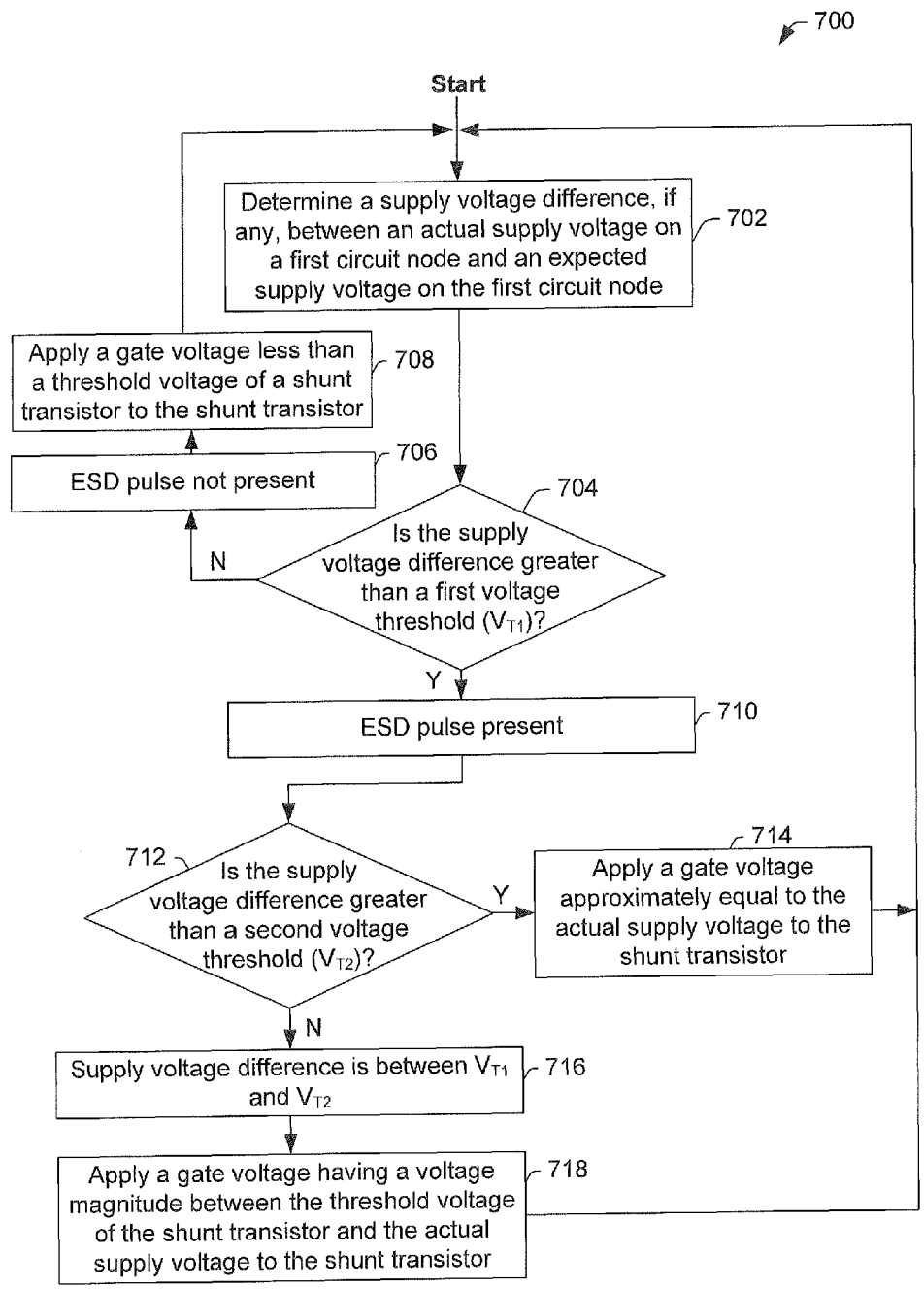
FIG. 7 shows an ESD protection method in accordance with some embodiments.

FIG. 7 shows an illustrative ESD protection methodology 700. While this method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

The method 700 starts at 702 by determining a supply voltage difference, if any, between an actual supply voltage on a first circuit node and an expected supply voltage on the first circuit node. For example, in some embodiments an expected supply voltage can be approximately 3.3 V with an acceptable variance of +/−100 mV. If the actual supply voltage is 15 V, there is a supply voltage difference of 11.7 V, while if the actual supply voltage is 2 V, there is a supply voltage difference of 1.3 V, for example.

In 704, the method determines whether the supply voltage difference is greater than a first voltage threshold VTthreshold1. If not ("N" at 704), an ESD pulse is not present (or is sufficiently small), so that the method proceeds to block 708 and applies a gate voltage of less than a threshold voltage of a shunt transistor to the shunt transistor (e.g., shunt transistor 606 in FIG. 6). Thus, at this time, limited or no current is shunted over the shunt transistor. Thus, if the expected supply voltage is 3.3V with an acceptable variance of +/−100 mV, the first voltage threshold is 100 mV. Accordingly, so long as the actual supply voltage is 3.3 V +/−100 mV, the method does not activate the shunt transistor.

However, if the supply voltage difference is greater than a first voltage threshold (VThreshold1) ("Y" at 704), an ESD pulse of sufficient magnitude is likely present as indicated by 710 and the method continues to 712, where it determines whether the supply voltage difference is greater than a second voltage threshold (VThreshold2).

If the supply voltage difference is greater than the second voltage threshold ("Y" at 712), a gate voltage approximately equal to the actual supply voltage is applied to the shunt transistor. At this time, a maximum current is shunted over the transistor. Thus, block 714 to correspond to, for example, a condition where the actual supply voltage briefly "spikes" up to 15 V. In this instance, the supply voltage difference of 11.7 V exceeds the second voltage threshold and the actual supply voltage of 15V is applied to the gate of the shunt transistor to prevent damage to the semiconductor device.

If the supply voltage difference is not greater than the second voltage threshold VThreshold2 ("N" at 712), a gate voltage having a voltage magnitude between the threshold voltage of the shunt transistor and the actual supply voltage is applied to the shunt transistor. At this time, analog tuning of the gate voltage occurs. Thus, block 718 corresponds to, for example, a condition where the actual supply voltage falls slightly outside of the expected supply voltage range. For example, the actual supply voltage could be approximately 3.0 V (i.e., supply voltage difference is greater than 100 mV but less than Vthreshold2), causing an analog voltage to be applied to the gate of the shunt transistor.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An electrostatic discharge (ESD) protection device for protecting a semiconductor device, the ESD protection device comprising:
    a trigger element to monitor power on a first circuit node and provide a trigger signal indicative of whether the monitored power is representative of an incoming ESD pulse;
    a variable resistor coupled between the first circuit node and a second circuit node and which is arranged to selectively shunt power of the incoming ESD pulse, if any, from the first circuit node to the second circuit node and away from the semiconductor device;
    a gate driver circuit to provide a gate voltage, which is based on the trigger signal and a control signal, to a control terminal of the variable resistor to enable the selective shunting of power; and
    wherein a regulator element provides the control signal to the gate driver circuit to selectively adjust the power shunted over the variable resistor.

2. The ESD protection device of claim 1, wherein a voltage level of the control signal reflects a relationship between a voltage on the first circuit node and a first voltage threshold.

3. The ESD protection device of claim 1, wherein the gate driver circuit comprises a series of driver elements in series with one another.

4. The ESD protection device of claim 3, wherein a first of the series of driver elements has an input coupled to the trigger element.

5. The ESD protection device of claim 3, wherein a last of the series of driver elements has an output coupled to the control terminal of the variable resistor.

6. The ESD protection device of claim 5, wherein the last driver element comprises:
    a first p-type transistor having a drain coupled to the first circuit node;
    an n-type transistor having a source coupled to the second circuit node; and
    a second p-type transistor having a drain coupled to a source of the first p-type transistor, wherein a source of the second p-type transistor and a drain of the n-type transistor are coupled to the control terminal of the variable resistor.

7. The ESD protection device of claim 6, wherein a control gate of the second p-type transistor is coupled to the regulator element and receives the control signal therefrom.

8. The ESD protection device of claim 7, wherein the control gate of the first p-type transistor and the control gate of the n-type transistor are both coupled to an output of a previous driver element in the series of driver elements.

9. The ESD protection device of claim 1, wherein the regulator element comprises a regulator current path extending between the first circuit node and second circuit node, the regulator comprising:
    a resistive element on the regulator current path;
    a regulator switch on the regulator current path; and
    a plurality of diodes on the regulator current path between the resistive element and the regulator switch, wherein the plurality of diodes are in series with one another and wherein a control node arranged between the resistive element and the plurality of diodes provides the control signal to the gate driver circuit.

10. The ESD protection device of claim 1, wherein the trigger element comprises: a resistor and a capacitor having a trigger node therebetween, wherein the trigger node provides the trigger signal to the gate driver circuit.

11. The ESD protection device of claim 1, wherein the variable resistor comprises an n-type transistor.

12. The ESD protection device of claim 1, wherein the variable resistor comprises a thyristor.

13. The ESD protection device of claim 1:
    wherein the first circuit node comprises a first external IC pin; and
    wherein the second circuit node comprises a second external IC pin.

14. The ESD protection device of claim 1, wherein the regulator element continuously monitors the voltage on the first circuit node throughout the ESD pulse and provides the control signal to selectively adjust the gate voltage during the ESD pulse.

15. The ESD protection device of claim 14, wherein the gate voltage controls the power shunted over the variable resistor so a voltage on the first circuit node is always higher than a predefined voltage threshold while the ESD protection device is on.

16. The ESD protection device of claim 1, wherein the regulator element is selectively activated based on the trigger signal from the trigger element.

17. The ESD protection device of claim 1, wherein the variable resistor comprises a resistor, and wherein the regulator element provides the control signal to the operate the transistor in an analog mode of operation.

18. A method of electrostatic discharge (ESD) protection in a circuit, wherein the circuit includes a variable resistor that is coupled between first and second circuit nodes and which is arranged to selectively shunt power of an incoming ESD pulse from the first circuit node to the second first circuit node and away from a semiconductor device in the circuit, the method comprising:
    comparing an actual power on the first circuit node to an expected power;
    providing a first control voltage to a control terminal of the variable resistor when the monitored power is less than a first power threshold, wherein the first control voltage is sufficient to place the variable resistor in a first resistive state where substantially no current flows there over;
    providing a second control voltage to the control terminal of the variable resistor when the monitored power is greater than a second power threshold, wherein the second power threshold is greater than the first power threshold and wherein the second control voltage is substantially equal to an actual voltage on the first circuit node and causes a second current to flow over the variable resistor; and
    providing an intermediate control voltage to the control terminal of the variable resistor based on whether the monitored power is between the first and second power thresholds, wherein the intermediate control voltage is greater than the first control voltage and less than the actual voltage and causes an intermediate current to flow over the variable resistor.

19. The method of claim 18, wherein the power is continuously monitored throughout the ESD pulse and the gate voltage is adjusted throughout a duration of the ESD pulse.

20. The method of claim 18, wherein the variable resistor comprises a transistor and wherein the first resistive state is a sub-threshold mode of operation of the transistor.

21. The method of claim 18, wherein the first power threshold is approximately equal to a DC supply voltage expected to be received on the first circuit node.

22. The method of claim 18, wherein comparing an actual power on the first circuit node to an expected power comprises: determining whether an actual voltage provided to the semiconductor device via the first circuit node is equal to an expected voltage.

23. The method of claim 18, wherein comparing an actual power on the first circuit node to an expected power comprises: determining whether an actual current provided to the semiconductor device via the first circuit node is equal to an expected current.

24. An electrostatic discharge (ESD) protection device for protecting a semiconductor device of a circuit, the ESD protection device comprising:

a trigger element to monitor power on a first circuit node and provide a trigger signal indicative of whether the monitored power is representative of an incoming ESD pulse;

a variable resistor coupled between the first circuit node and a second circuit node and which is arranged to selectively shunt power of the incoming ESD pulse, if any, from the first circuit node to the second circuit node and away from the semiconductor device;

a gate driver circuit to provide a control voltage to a control terminal of the variable resistor to enable the selective shunting of power, wherein the control voltage is based on the trigger signal and a control signal, wherein the control signal selectively adjusts the control voltage throughout the duration of the incoming ESD pulse.

25. The ESD protection device of claim 24, wherein the variable resistor comprises an n-type transistor.

26. The ESD protection device of claim 24, wherein the variable resistor comprises a thyristor.

* * * * *